(12) United States Patent
Chang

(10) Patent No.: US 6,198,519 B1
(45) Date of Patent: Mar. 6, 2001

(54) LIQUID CRYSTAL DISPLAY PANELS INCLUDING ALIGNMENT PATTERNS AND RELATED METHODS

(75) Inventor: Jong-woong Chang, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 08/808,887

(22) Filed: Feb. 28, 1997

(30) Foreign Application Priority Data

Feb. 28, 1996 (KR) ...................................................... 96-5056

(51) Int. Cl.[7] ...................... G02F 1/1337; G02F 1/1345; G02F 1/1343
(52) U.S. Cl. .......................... 349/129; 349/139; 349/150; 349/151; 349/152; 349/153; 250/559; 29/830
(58) Field of Search ..................... 349/129, 152, 349/149–151, 153, 139; 29/830; 250/559

(56) References Cited

U.S. PATENT DOCUMENTS

| | | | |
|---|---|---|---|
| 5,317,438 | * 5/1994 | Suzuki et al. | 359/88 |
| 5,434,429 | * 7/1995 | Dillen et al. | 250/559 |
| 5,526,563 | * 6/1996 | Tamaki et al. | 29/830 |
| 5,576,869 | * 11/1996 | Yoshida | 349/149 |
| 5,657,104 | * 8/1997 | Kanezawa | 349/149 |
| 5,822,030 | * 10/1998 | Uchiyama | 349/149 |
| 5,982,468 | * 11/1999 | Satou et al. | 349/150 |
| 6,052,172 | * 4/2000 | Kajiwara et al. | 349/152 |

* cited by examiner

*Primary Examiner*—William L. Sikes
*Assistant Examiner*—Julie Ngo
(74) *Attorney, Agent, or Firm*—Myers Bigel Sibley & Sajovec

(57) ABSTRACT

A liquid crystal display includes a liquid crystal display panel having a face and a data/gate pad on the face of the liquid crystal display panel wherein the data/gate pad includes a metal layer. A dummy pad is also on the face of the liquid crystal display panel wherein the dummy pad includes an alignment pattern therein. In particular, the alignment pattern can be a vernier pattern. Related methods are also discussed.

22 Claims, 3 Drawing Sheets

LIQUID CRYSTAL DISPLAY PANELS INCLUDING ALIGNMENT PATTERNS AND RELATED METHODS

FIELD OF THE INVENTION

The present invention relates to the field of displays and more particularly to liquid crystal displays.

BACKGROUND OF THE INVENTION

A conventional method for bonding out lead bonding (OLB) pads and tape carrier package (TCP) pads is described below with reference to FIGS. 1 and 2. The dummy pad groups 10 and the data/gate pad group 20 are formed on a liquid crystal display (LCD) panel 100 as shown in FIG. 1. The dummy pad groups 10 are formed on both sides of data/gate pad group 20. Generally, each of the pads in groups 10 and 20 includes a metal pad 12 and a layer of indium tin oxide (ITO) 13 formed on one end portion of the respective metal pad 12. The dummy pad group also includes ITO dummy pads 30, wherein each of the ITO dummy pads includes only a layer of ITO.

Each of the ITO layers 13 and the ITO dummy pads 30 in each pad group 10 or 20 correspond to a respective TCP OLB pad 40, and are bonded by an anisotropic conductive layer (ACL) 50 therebetween, as shown in FIG. 2. The ITO layers 13 enable the pad groups 10 and 20 to be bonded with the TCP OLB pads 40, and the ITO dummy pads 30 enable the misalignment of the pads to be tested as the pads are bonded on the basis of the ITO dummy pad 30.

It may be difficult to test misalignment of the ITO dummy pad 30, however, because the ITO layer is transparent. In addition, measurement of any misalignment may be difficult because the pad pitch can become fine gradually. Accordingly, there continues to exist a need in the art for improved alignment tests which will allow increased productivity and reduced cost.

SUMMARY OF THE INVENTION

It is therefor an object of the present invention to provide improved liquid crystal displays and related methods.

It is another object of the present invention to provide liquid crystal displays having improved alignment and related methods.

These and other objects are provided according to the present invention by a liquid crystal display comprising a liquid crystal display panel. In addition, a dummy pad is provided on the face of the liquid crystal display panel wherein the dummy pad includes an alignment pattern therein. Accordingly, the alignment pattern can be used to determine any misalignment between the liquid crystal display panel and a bonding pad of a tape carrier package. In particular, the alignment pattern can be a vernier pattern or a saw tooth pattern. The liquid crystal display can also include a data/gate pad on the face of the liquid crystal display panel wherein the data/gate pad includes a metal layer.

The liquid crystal display can also include a tape carrier package layer adjacent the data pad and the dummy pad opposite the face of the liquid crystal display panel, and an out lead bonding pad on the tape carrier package layer adjacent the alignment pattern of the dummy pad wherein the alignment pattern indicates an alignment of the out lead bonding pad relative to the dummy pad. As discussed above, the alignment pattern can be used to determine misalignment between the liquid crystal display panel and the tape carrier package which can be bonded together. In particular, the liquid crystal display panel and the tape carrier package can be bonded by an anisotropic conductive material therebetween.

The dummy pad can include a layer of a transparent conductive material on the alignment pattern, and the alignment pattern can be a layer of a metal with the alignment pattern therein. This metal can be chromium or tantalum, and the dummy pad can include a layer of indium tin oxide on the alignment pattern.

According to an alternate aspect of the present invention, a method for forming a liquid crystal display is provided. This method includes the step of forming a data pad on a face of a liquid crystal display panel wherein the data pad includes a first metal layer. In addition, a dummy pad is formed on the face of the liquid crystal display panel wherein the dummy pad includes an alignment pattern therein.

According to the displays and methods of the present invention, misalignment between a liquid crystal display panel and a tape carrier package can be accurately determined. Furthermore, misalignment can thus be reduced.

DETAILED DESCRIPTION

Figure 1:
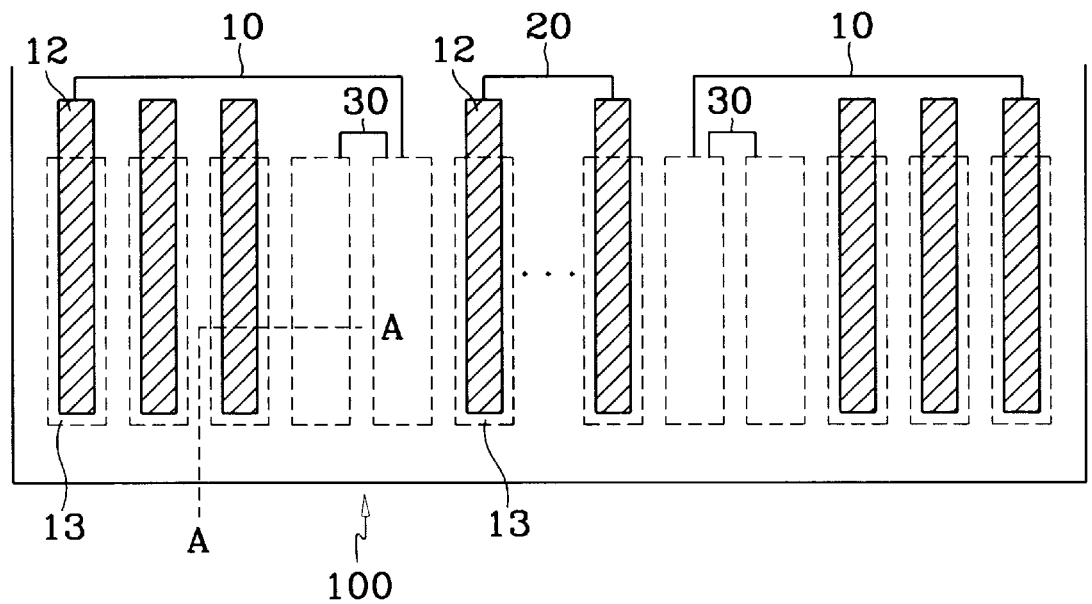
FIG. 1 is a plan view illustrating an out lead bonding pattern for a liquid crystal display according to the prior art.
Figure 2:
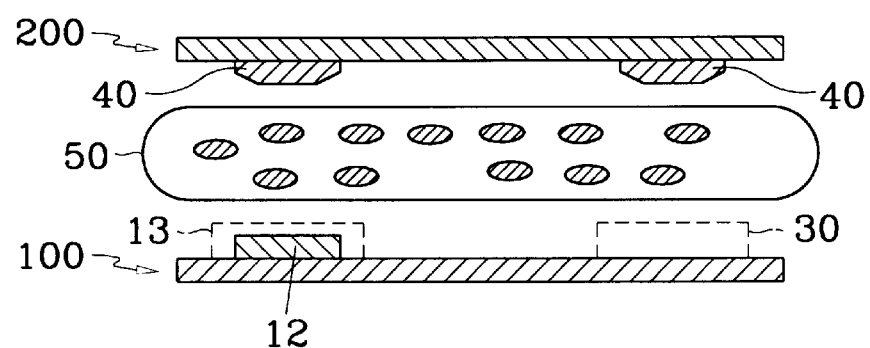
FIG. 2 is a cross sectional view illustrating the out lead bonding pattern according to FIG. 1.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figure 3:
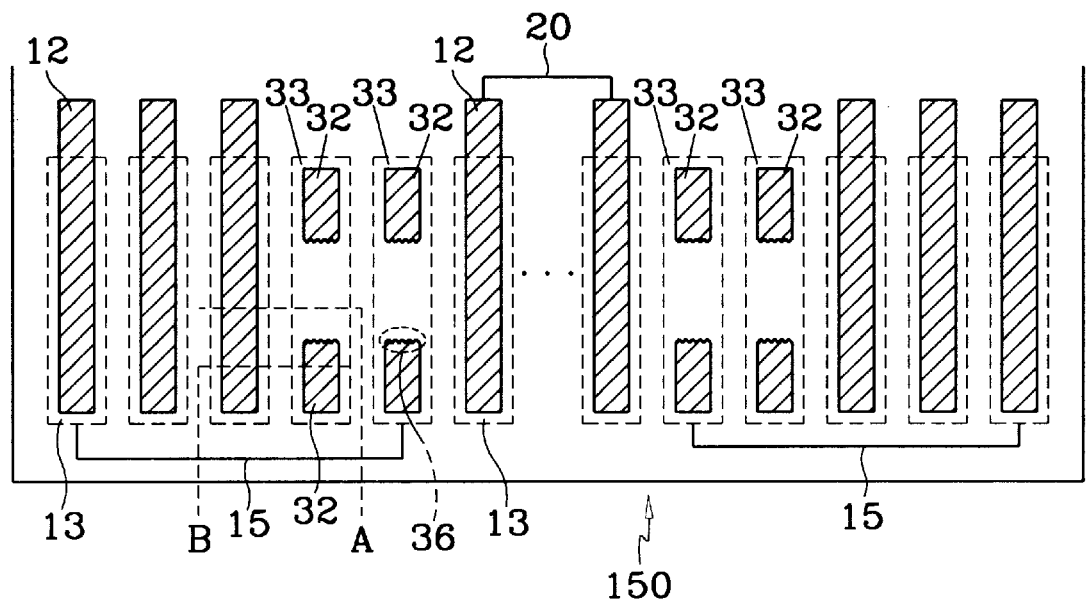
FIG. 3 is a plan view illustrating an out lead bonding pattern for a liquid crystal display according to the present invention.

A liquid crystal display according to the present invention includes data/gate pads 20 and dummy pads 15, as shown in FIG. 3. In particular, the data/gate and dummy pads are formed on a liquid crystal display panel 150, such that the data/gate pads 20 are between two groups of the dummy pads 15 on the liquid crystal display panel. The data/gate and at least one of the dummy pads includes a metal layer 12 and an indium tin oxide layer 13 on an end portion of the metal layer.

As further shown, another one of the dummy pads 15 includes a metal pattern 32, and an indium tin oxide layer 33 can be formed on the metal pattern. The metal pattern 32 can include a vernier pattern 36, such as a saw tooth pattern at the end of the metal pattern. The metal pattern 32 can be formed from a layer of chromium or tantalum, and can be used to test alignment with tape carrier package pads.

Figure 4:
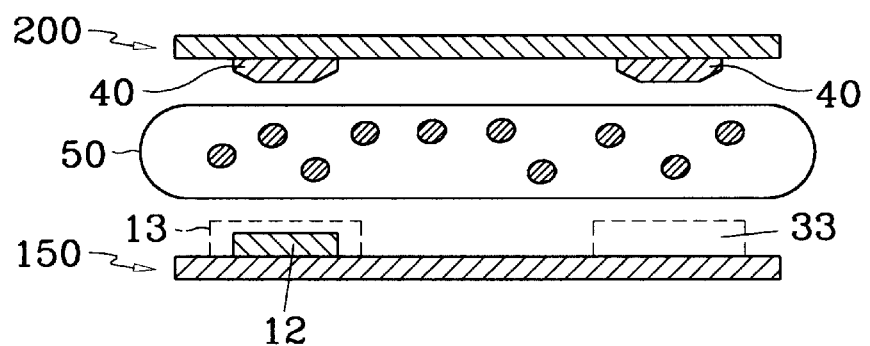
FIG. 4 is a cross sectional view taken along section line A of FIG. 3.
Figure 5:
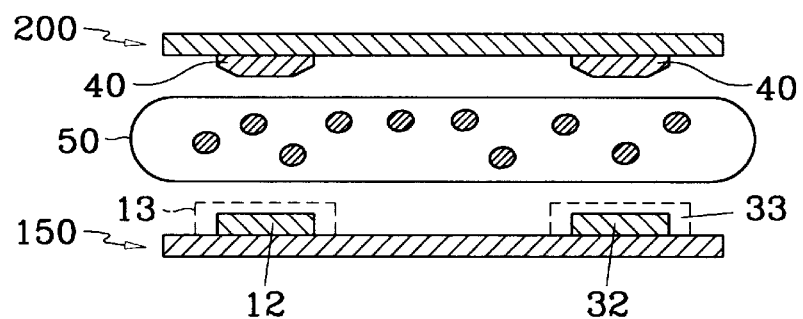
FIG. 5 is a cross sectional view taken along section line B of FIG. 3.

As shown in FIG. 4 and FIG. 5, the tape carrier package (TCP) out lead bonding (OLB) pads 40 correspond to respective indium tin oxide layers 13 and indium tin oxide layers 33. In addition, the TCP OLB pads 40 are bonded to the LCD OLB pads by the anisotropic conductive layer (ACL) 50 between the TCP panel 200 and the LCD panel 150. The cross sectional view of FIG. 4 shows a portion of the ITO dummy pad 33 without the metal pattern 32, and the cross sectional view of FIG. 5 shows another portion of the ITO dummy pad 33 with the metal pattern 32.

Figure 6:
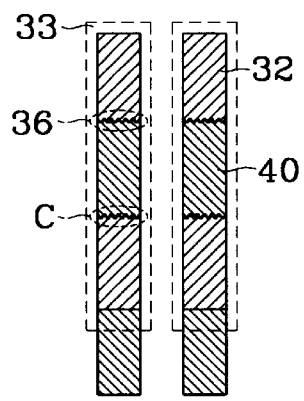
FIG. 6 is a plan view illustrating an ITO pad after bonding a liquid crystal display panel and a tape carrier package according to the present invention.
Figure 7:
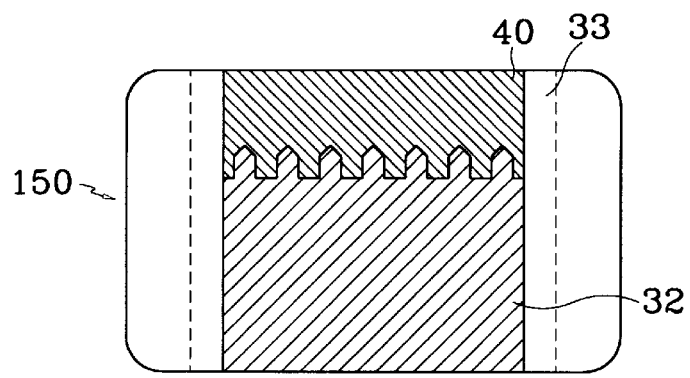
FIG. 7 is an enlarged view of the vernier pattern of FIG. 7.

As shown in FIG. 6 and FIG. 7, a metal pattern 32 does not extend along an entire ITO dummy pad 33. The tape carrier package (TCP) pads 40 are arranged between respective ITO dummy pads 32 when the tape carrier package pads and the ITO dummy pads are properly arranged. Accordingly, the vernier pattern 36 can be used to measure misalignment when the ITO dummy pads 33 are bonded adjacent the TCP pads 40. In particular, the alignment can be observed through the transparent ITO layer. The vernier pattern 36 of the metal patterns 32 of the ITO dummy pads 33 are adjacent the TCP pads 40 as shown when the metal patterns and the TCP pads are properly aligned.

The misalignment can be defined as the degree to which the ITO dummy pads 33 and the TCP pads 40 cross, and any misalignment thereof can be tested and reduced using the metal patterns and the vernier pattern. Accordingly, misalignment between the LCD panel and the tape carrier package can be tested with relative accuracy using the metal patterns with the vernier pattern and the ITO layers, and the quality of the bonding of the LCD panel OLB pads and the TCP OLB pads can be increased.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A liquid crystal display comprising:
   a liquid crystal display panel including a face; and
   a dummy pad on said face of said liquid crystal display panel wherein said dummy pad includes a first alignment pattern wherein said first alignment pattern comprises a first metal layer;
   wherein said dummy pad includes a second alignment pattern wherein said second alignment pattern comprises a second metal layer spaced apart from said first metal layer wherein said dummy pad further comprises a continuous laver of a transparent conductive material on said first and second metal layers.

2. A liquid crystal display according to claim 1 further comprising a data/gate pad on said face of said liquid crystal display panel wherein said data/gate pad includes a metal layer.

3. A liquid crystal display according to claim 1 further comprising:
   a tape carrier package layer adjacent said dummy pad opposite said face of said liquid crystal display panel; and
   an out lead bonding pad on said tape carrier package layer adjacent said first alignment pattern of said dummy pad wherein said first alignment pattern indicates an alignment of said out lead bonding pad relative to said dummy pad.

4. A liquid crystal display according to claim 3 wherein said liquid crystal display panel and said tape carrier package are bonded together.

5. A liquid crystal display according to claim 4 wherein said liquid crystal display panel and said tape carrier package are bonded by an anisotropic conductive material therebetween.

6. A liquid crystal display comprising:
   a liquid crystal display panel including a face; and
   a dummy pad on said face of said liquid crystal display panel wherein said dummy pad includes an alignment pattern therein wherein said alignment pattern comprises a vernier pattern.

7. A liquid crystal display according to claim 6 wherein said dummy pad comprises a layer of a transparent conductive material on said alignment pattern.

8. A liquid crystal display according to claim 6 wherein said alignment pattern comprises a layer of a metal with said alignment pattern in the metal layer.

9. A liquid crystal display according to claim 8 wherein said metal is chosen from the group consisting of chromium and tantalum.

10. A liquid crystal display according to claim 8 wherein said dummy pad comprises a layer of indium tin oxide on said alignment pattern.

11. A method for forming a liquid crystal display, said method comprising the steps of:
    providing a liquid crystal display panel having a face; and
    forming a dummy pad on said face of said liquid crystal display panel wherein said dummy pad includes a first alignment pattern wherein said step of forming said dummy pad comprises forming a first metal layer;
    wherein said dummy pad includes a second alignment pattern wherein said step of forming said dummy pad comprises forming a second metal layer spaced apart from said first metal layer and forming a continuous laver of a transparent conductive material on said first and second metal layers.

12. A method according to claim 11 further comprising the steps of forming a data pad on a face of a liquid crystal display panel wherein said data pad includes a metal layer.

13. A method according to claim 11 further comprising the steps of:
    forming an out lead bonding pad on a tape carrier package layer; and
    bonding said tape carrier package layer and said liquid crystal display panel so that said out lead bonding pad is adjacent said first alignment pattern of said dummy pad and said first alignment pattern indicates an alignment of said out lead bonding pad relative to said dummy pad.

14. A method according to claim 13 wherein said liquid crystal display panel and said tape carrier package are bonded by an anisotropic conductive material.

15. A method for forming a liquid crystal display, said method comprising the steps of:
    providing a liquid crystal display panel having a face;
    forming a dummy pad on said face of said liquid crystal display panel wherein said dummy pad includes first and second spaced apart alignment patterns therein;
    forming an out lead bonding pad on a tape carrier package layer; and aligning said out lead bonding pad using said first and second spaced apart alignment patterns.

16. A method for forming a liquid crystal display, said method comprising the steps of:

providing a liquid crystal display panel having a face; and forming a dummy pad on said face of said liquid crystal display panel wherein said dummy pad includes an alignment pattern therein wherein said alignment pattern comprises a vernier pattern.

17. A method according to claim 16 wherein said step of forming said dummy pad comprises the step of forming a layer of a transparent conductive material on said alignment pattern.

18. A method according to claim 16 wherein said step of forming said dummy pad comprises forming a layer of a metal with said alignment pattern in the metal layer.

19. A method according to claim 18 wherein said metal is chosen from the group consisting of chromium and tantalum.

20. A method according to claim 18 wherein said step of forming said dummy pad further comprises forming a layer of indium tin oxide on said alignment pattern.

21. A liquid crystal display comprising:

a liquid crystal display panel including face; and a dummy pad on said face of said liquid crystal display panel wherein said dummy pad includes an alignment pattern therein wherein said alignment pattern comprises a saw tooth pattern.

22. A method for forming a liquid crystal display, said method comprising the steps of:

providing a liquid crystal display panel having a face; and forming a dummy pad on said face of said liquid crystal display panel wherein said dummy pad includes an alignment pattern therein wherein said alignment pattern comprises a saw tooth pattern.

\* \* \* \* \*